United States Patent
Lin et al.

(10) Patent No.: US 9,024,441 B2
(45) Date of Patent: May 5, 2015

(54) BUMP STRUCTURE AND ELECTRONIC PACKAGING SOLDER JOINT STRUCTURE AND FABRICATING METHOD THEREOF

(75) Inventors: Yu-Min Lin, Changhua County (TW); Chau-Jie Zhan, New Taipei (TW); Tao-Chih Chang, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/484,289

(22) Filed: May 31, 2012

(65) Prior Publication Data

US 2013/0168851 A1  Jul. 4, 2013

(30) Foreign Application Priority Data

Dec. 30, 2011  (TW) .............................. 100150088 A

(51) Int. Cl.
*H01L 23/48*  (2006.01)
*H01L 23/52*  (2006.01)
(Continued)

(52) U.S. Cl.
CPC ............ *H01L 24/13* (2013.01); *H01L 23/49816* (2013.01); *H01L 24/11* (2013.01); *H01L 24/16* (2013.01); *H01L 24/81* (2013.01); *H01L 2224/0346* (2013.01); *H01L 2224/05022* (2013.01); *H01L 2224/05124* (2013.01); *H01L 2224/05147* (2013.01); *H01L 2224/05155* (2013.01); *H01L 2224/05552* (2013.01); *H01L 2224/05559* (2013.01); *H01L 2224/05572* (2013.01); *H01L 2224/05613* (2013.01); *H01L 2224/05618* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01);
(Continued)

(58) Field of Classification Search
CPC .......... H01L 24/07–24/10; H01L 24/15–24/17
USPC .......... 438/612, 613, 614, 658, 660; 257/737, 257/738, 779
See application file for complete search history.

(56) References Cited

U.S. PATENT DOCUMENTS 5,640,052 A * 6/1997 Tsukamoto ................... 257/781
5,985,692 A * 11/1999 Poenisch et al. .............. 438/106
(Continued)

FOREIGN PATENT DOCUMENTS

CN 101075595 11/2007
CN 102142418 8/2011
(Continued)

OTHER PUBLICATIONS

Chau-Jie Zhan, et al., "Assembly and reliability characterization of 3D chip stacking with 30um pitch lead-free solder micro bump interconnection," IEEE Electronic Components and Technology Conference, 2010, pp. 1043-1049.
(Continued)

*Primary Examiner* — David Zarneke
(74) *Attorney, Agent, or Firm* — Jianq Chyun IP Office

(57) ABSTRACT

A bump structure includes a substrate, a pad, an electrode and a protruding electrode. The pad is disposed on the substrate. The electrode is formed by a first metal material and disposed on the pad. The protruding electrode is formed by a second metal material and disposed on the electrode, wherein a cross-sectional area of the protruding electrode is less than a cross-sectional area of the electrode.

6 Claims, 6 Drawing Sheets

(51) Int. Cl.
*H01L 29/40* (2006.01)
*H01L 23/00* (2006.01)
*H01L 23/498* (2006.01)

(52) U.S. Cl.
CPC ......... *H01L2224/05666* (2013.01); *H01L 2224/05671* (2013.01); *H01L 2224/05684* (2013.01); *H01L 2224/11462* (2013.01); *H01L 2224/1147* (2013.01); *H01L 2224/115* (2013.01); *H01L 2224/11848* (2013.01); *H01L 2224/11906* (2013.01); *H01L 2224/13076* (2013.01); *H01L 2224/13111* (2013.01); *H01L 2224/13113* (2013.01); *H01L 2224/13118* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13166* (2013.01); *H01L 2224/13171* (2013.01); *H01L 2224/13184* (2013.01); *H01L 2224/16145* (2013.01); *H01L 2224/16238* (2013.01); *H01L 2224/16503* (2013.01); *H01L 2224/16507* (2013.01); *H01L 2224/81097* (2013.01); *H01L 2224/81193* (2013.01); *H01L 2224/8181* (2013.01); *H01L 2924/00* (2013.01); *H01L 2924/00012* (2013.01); *H01L 2924/00014* (2013.01); *H01L 2924/01014* (2013.01); *H01L 2924/01029* (2013.01); *H01L 2924/01047* (2013.01); *H01L 2924/0105* (2013.01); *H01L 2924/10253* (2013.01)

(56) References Cited

U.S. PATENT DOCUMENTS

| | | | |
|---|---|---|---|
| 6,297,559 B1 | 10/2001 | Call et al. | |
| 6,356,333 B1 | 3/2002 | Uchiyama | |
| 6,451,875 B1 | 9/2002 | Suga et al. | |
| 6,583,512 B2 * | 6/2003 | Nakaoka et al. | 257/777 |
| 6,642,079 B1 * | 11/2003 | Liu et al. | 438/108 |
| 6,906,427 B2 | 6/2005 | Tanaka et al. | |
| 6,938,815 B2 | 9/2005 | Li | |
| 7,224,067 B2 | 5/2007 | Suh | |
| 7,384,863 B2 * | 6/2008 | Shibata | 438/614 |
| 7,436,073 B2 * | 10/2008 | Tanaka | 257/781 |
| 7,462,940 B2 | 12/2008 | Bauer et al. | |
| 7,528,487 B2 | 5/2009 | Imai | |
| 7,629,246 B2 | 12/2009 | Patwardhan et al. | |
| 7,939,939 B1 * | 5/2011 | Zeng et al. | 257/737 |
| 8,330,272 B2 * | 12/2012 | Haba | 257/737 |
| 2002/0090756 A1 | 7/2002 | Tago et al. | |
| 2007/0075435 A1 | 4/2007 | Suminoe et al. | |
| 2007/0152331 A1 * | 7/2007 | Kang et al. | 257/737 |
| 2007/0284741 A1 * | 12/2007 | Hua et al. | 257/738 |
| 2008/0237314 A1 | 10/2008 | Yu et al. | |
| 2010/0246150 A1 * | 9/2010 | Wong et al. | 361/770 |
| 2011/0001250 A1 * | 1/2011 | Lin et al. | 257/778 |
| 2011/0062580 A1 * | 3/2011 | Liu et al. | 257/737 |
| 2011/0088935 A1 | 4/2011 | Ishimatsu et al. | |
| 2011/0101523 A1 * | 5/2011 | Hwang et al. | 257/737 |
| 2011/0101526 A1 * | 5/2011 | Hsiao et al. | 257/738 |
| 2011/0285015 A1 * | 11/2011 | Song et al. | 257/737 |
| 2011/0317385 A1 * | 12/2011 | Zhou et al. | 361/771 |
| 2012/0025362 A1 * | 2/2012 | Chandrasekaran et al. | 257/680 |
| 2012/0083113 A1 * | 4/2012 | Arvin et al. | 438/613 |
| 2012/0156512 A1 * | 6/2012 | Nakano et al. | 428/457 |
| 2012/0273951 A1 * | 11/2012 | Getty et al. | 257/751 |

FOREIGN PATENT DOCUMENTS

| | | |
|---|---|---|
| CN | 102222747 | 10/2011 |
| TW | 200607030 | 2/2006 |
| TW | 200607416 | 2/2006 |
| TW | 200633609 | 9/2006 |
| TW | 201133733 | 10/2011 |

OTHER PUBLICATIONS

Yu-Min Lin, et al.,"Electromigration in Ni/Sn intermetallic micro bump joint for 3D IC chip stacking", IEEE Electronic Components and Technology Conference, 2011, pp. 351-357.

Su-Tsai Lu, et al., "A Novel Compliant-Bump Structure for ACA-Bonded Chip-on-Flex (COF) Interconnects with Ultra-Fine Pitch", IEEE Electronics Components and Technology Conference, 2009, pp. 1544-1551.

Laura Frisk, et al., "Reliability of ACF Interconnections on FR-4 Substrates", IEEE Transactions on components and packaging technologies, Mar. 2010, vol. 33, No. 1, pp. 138-147.

Jong-Woong Kim, et al., "Reliability of adhesive interconnections for application in display module", Microelectronic Engineering 84, 2007, pp. 2691-2696.

"Office Action of Taiwan Counterpart Application", issued on Mar. 19, 2014, p. 1-p. 6.

"Office Action of Taiwan Counterpart Application", issued on Aug. 8, 2014, p. 1-p. 6.

* cited by examiner

BUMP STRUCTURE AND ELECTRONIC PACKAGING SOLDER JOINT STRUCTURE AND FABRICATING METHOD THEREOF

CROSS-REFERENCE TO RELATED APPLICATION

This application claims the priority benefit of Taiwan application serial no. 100150088, filed on Dec. 30, 2011. The entirety of the above-mentioned patent application is hereby incorporated by reference herein and made a part of this specification.

BACKGROUND OF THE DISCLOSURE

1. Field of the Disclosure

The disclosure relates to a bump structure and an electronic packaging solder joint structure and a fabricating method thereof. Particularly, the disclosure relates to a bump structure used to form an intermetallic compound, and an electronic packaging solder joint structure having the intermetallic compound and a fabricating method thereof.

2. Description of Related Art

In an electronic packaging process, commonly used solder joints is micro solder joints. The bonding method of the micro solder joints mainly uses an eutectic bonding and is an irreversible chemical reaction. Intermetallic compound (IMC) is formed by an interreaction between a part of the metal and the solder in the solder joint after eutectic bonding.

Because a general micro solder joint has a less content of the IMC therein, the micro solder joint has better flexibility and toughness, which leads to better capability in anti-mechanical stress, though the micro solder joint has a poor capability in anti-electromigration (EM).

In a situation of increasing heating time or temperature on purpose, or after a temperature cycling reliability testing process, the micro solder joint forms a great content of the IMC very fast due to a high temperature, and the solder has be totally transformed to the IMC. The micro solder joint having the great content of the IMC has hardness higher than that of the original micro solder joint, which has higher rigidity and is lack of flexibility, so that the micro solder joint having the great content of the IMC is liable to be damaged in the temperature cycling reliability testing process. However, the micro solder joint has a characteristic of mitigating an electromigration effect by increasing the content of the IMC.

Therefore, an electronic packaging solder joint structure having both of the characteristics of anti-mechanical stress and anti-electromigration effect is required to be developed, so as to improve reliability and performance of the solder joint.

SUMMARY OF THE DISCLOSURE

The disclosure is directed to a bump structure, which is used to form an intermetallic compound with a specific shape.

The disclosure is directed to a method for fabricating an electronic packaging solder joint structure, by which the electronic packaging solder joint structure with better reliability and performance is fabricated.

The disclosure provides a bump structure including a substrate, a pad, an electrode and a protruding electrode. The pad is disposed on the substrate. The electrode is formed by a first metal material and is disposed on the pad. The protruding electrode is formed by a second metal material and is disposed on the electrode, wherein a cross-sectional area of the protruding electrode is less than a cross-sectional area of the electrode.

The disclosure provides an electronic packaging solder joint structure including a first substrate, a second substrate and a solder joint. The first substrate includes at least a first electrode disposed on the first substrate. The second substrate includes at least a second electrode disposed on the second substrate. The solder joint is disposed between the first electrode and the second electrode, and includes an intermetallic compound layer and a conductive material layer. The intermetallic compound layer is a continuous structure, and is directly connected to the first electrode and the second electrode. The conductive material layer is disposed around the intermetallic compound layer and covers the intermetallic compound layer.

The disclosure provides a method for fabricating an electronic packaging solder joint structure, which includes following steps. A first substrate is provided, and at least a first electrode, at least a first protruding electrode and at least a first conductive material have been formed on the first substrate, where the first protruding electrode is formed on the first electrode, and the first conductive material covers the first electrode and the first protruding electrode. A second substrate is provided, and at least a second electrode, at least a second protruding electrode and at least a second conductive material have been formed on the second substrate, where the second protruding electrode is formed on the second electrode, and the second conductive material covers the second electrode and the second protruding electrode. A bonding process is performed on the first substrate and the second substrate to connect the first protruding electrode and the second protruding electrode to form an intermetallic compound layer, where the intermetallic compound layer is a continuous structure, and is directly connected to the first electrode and the second electrode.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

FIGS. 1A-1F are cross-sectional views of a fabrication process of an electronic packaging solder joint structure according to an embodiment of the disclosure.

Figure 1A:
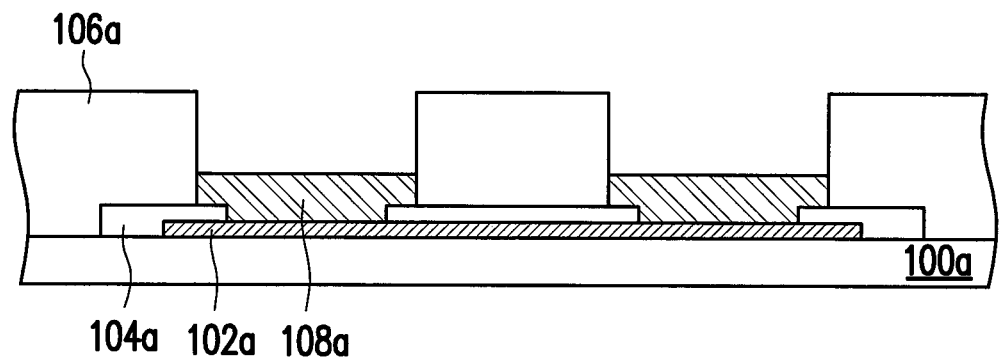
FIGS. 1A-1F are cross-sectional views of a fabrication process of an electronic packaging solder joint structure according to an embodiment of the disclosure.

Referring to FIG. 1A, a substrate 100a is provided. The substrate 100a can have a pad 102a and a passivation layer 104a formed thereon. The pad 102a is formed on the substrate 100a for electrically connecting a metal interconnect (not shown) in internal of the substrate 100a. The substrate 100a is, for example, an organic carrier or an inorganic carrier. The organic carrier is, for example, a printed circuit board (PCB). The inorganic carrier is, for example, a silicon chip. A material of the pad 102a is, for example, aluminium, aluminium silicon, aluminium silicon copper, copper or nickel, etc. The passivation layer 104a is formed on the substrate 100a and the pad 102a, and exposes a part of the pad 102a. A material of the passivation layer 104a is, for example, polyimide (PI), polybenzoxazole (PBO), Ajinomoto build-up film (ABF), $Si_xO_y$, or $Si_xN_y$, etc. The pad 102a and the passivation layer 104a are, for example, respectively formed through a deposition process and a patterning process.

A patterned photoresist layer 106a is formed on the substrate 100a, and the patterned photoresist layer 106a exposes the pad 102a. In the present embodiment, the patterned photoresist layer 106a further exposes a part of the passivation layer 104a. A material of the patterned photoresist layer 106a is, for example, positive photoresist or negative photoresist. The patterned photoresist layer 106a is, for example, formed through a photolithography process.

At least one electrode 108a is formed on the pad 102a and the passivation layer 104a exposed by the patterned photoresist layer 106a. A material of the electrode 108a is, for example, Cu, Ag, Ni, Al, Ti, W, Cr, Au, Zn, Bi, In or alloys thereof, etc. A method of forming the electrode 108a is, for example, electroplating. Although the electrode 108a is formed through the aforementioned method, the disclosure is not limited thereto.

Figure 1B:
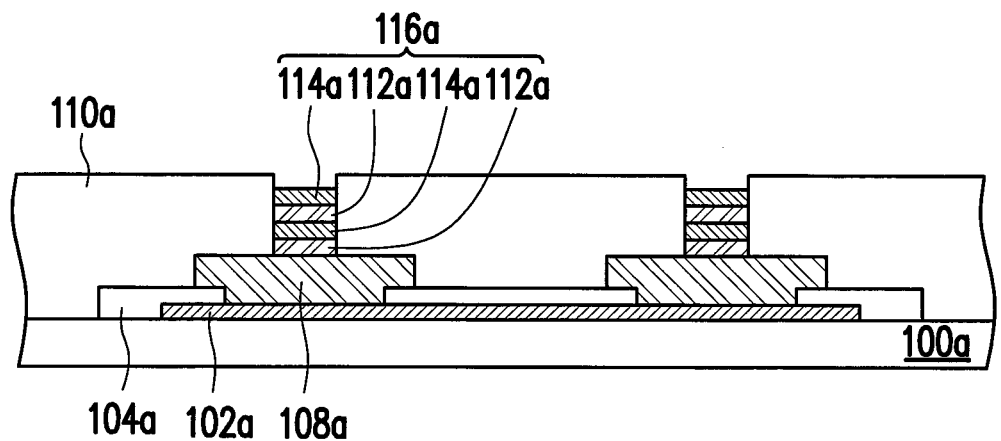

Referring to FIG. 1B, the patterned photoresist layer 106a is removed, and a method of removing the patterned photoresist layer 106a is, for example, a dry-type photoresist removing method.

A patterned photoresist layer 110a is formed on the substrate 100a, and the patterned photoresist layer 110a exposes a part of the electrode 108a. A material of the patterned photoresist layer 110a is, for example, positive photoresist or negative photoresist. The patterned photoresist layer 110a is, for example, formed through a photolithography process.

Moreover, a metal stacking structure 116a formed by alternately stacking at least one metal layer 112a and at least one metal layer 114a is formed on the electrode 108a exposed by the patterned photoresist layer 110a. A material of the metal layer 112a is, for example, Cu, Ag, Ni, Al, Ti, W, Cr, Au, Zn, Bi, In or alloys thereof, etc., and a material of the metal layer 114a is, for example, Sn. A method of forming the metal layer 112a and the metal layer 114a is, for example, electroplating.

Figure 1C:
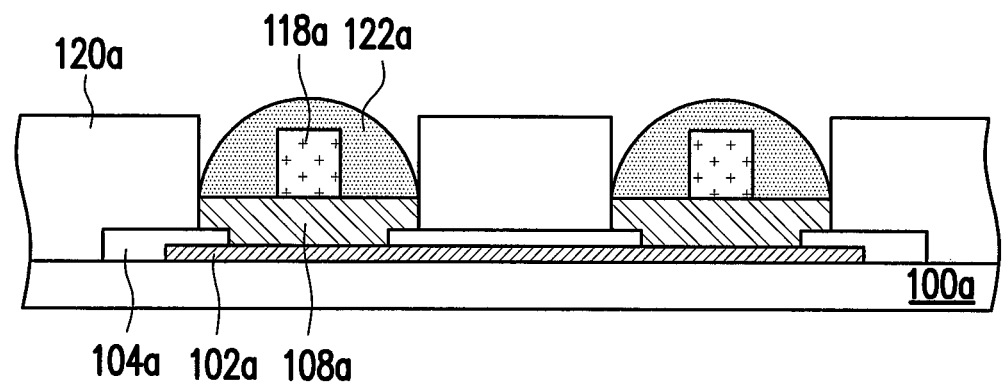

Referring to FIG. 1C, the patterned photoresist layer 110a is removed. A method of removing the patterned photoresist layer 110a is, for example, the dry-type photoresist removing method.

A thermal process is performed on the metal stacking structure 116a, so that the metal layer 112a and the metal layer 114a react to form at least one protruding electrode 118a on the electrode 108a. A material of the protruding electrode 118a is, for example, an intermetallic compound, for example, $Cu_xSn_y$, $Ni_xSn_y$, $In_xSn_y$, $Zn_xSn_y$ or $Au_xSn_y$, etc. The thermal process is, for example, a reflow process or an aging process. A heating temperature of the thermal process is, for example, 150° C.-300° C., and a heating time of the thermal process is, for example, 3 seconds to 60 minutes. Although the protruding electrode 118a is formed through the aforementioned method, the disclosure is not limited thereto.

A patterned photoresist layer 120a is formed on the substrate 100a, where the patterned photoresist layer 120a exposes the electrode 108a and the protruding electrode 118a. A material of the patterned photoresist layer 120a is, for example, positive photoresist or negative photoresist. The patterned photoresist layer 120a is, for example, formed through a photolithography process.

At least one conductive material 122a is formed to cover the electrode 108a and the protruding electrode 118a. A material of the conductive material 122a is, for example, Sn, SnAg or SnAgCu, etc., and a method of forming the conductive material 122a is, for example, electroplating.

Figure 1D:
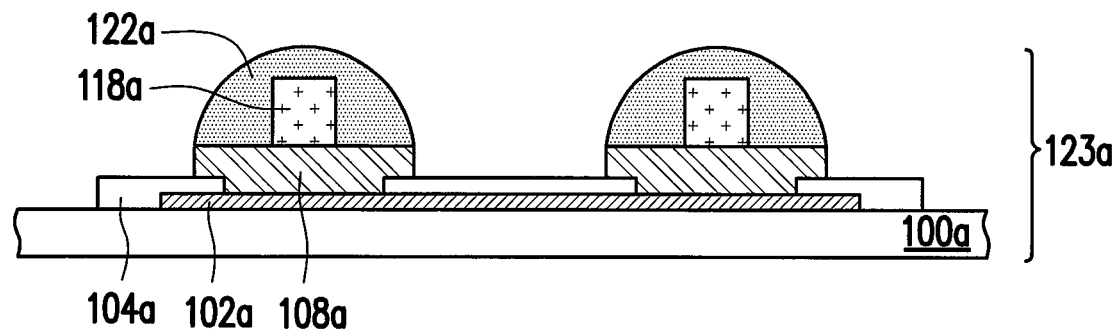

Referring to FIG. 1D, the patterned photoresist layer 120a is removed, and a method of removing the patterned photoresist layer 120a is, for example, the dry-type photoresist removing method.

Now, the electrode 108a, the protruding electrode 118a and the conductive material 122a are formed on the substrate 100a, where the protruding electrode 118a is formed on the electrode 108a, and the conductive material 122a covers the electrode 108a and the protruding electrode 118a. Moreover, the pad 102a and the passivation layer 104a are further formed on the substrate 100a. The pad 102a is formed on the substrate 100a. The passivation layer 104a is formed on the substrate 100a and the pad 102a, and exposes a part of the pad 102a.

Here, a bump structure 123a is described with reference of FIG. 1D. The bump structure 123a includes the substrate 100a, the electrode 108a and the protruding electrode 118a. The electrode 108a is disposed on the substrate 100a. The protruding electrode 118a is disposed on the electrode 108a, where a cross-sectional area of the protruding electrode 118a is less than a cross-sectional area of the electrode 108a. A width of the protruding electrode 118a is, for example, smaller than a width of the electrode 108a. Moreover, the bump structure 123a further includes the pad 102a, the passivation layer 104a and the conductive material 122a. The pad 102a is disposed between the substrate 100a and the electrode 108a. The passivation layer 104a is disposed on the substrate 100a and the pad 102a, and exposes a part of the pad 102a. The conductive material 122a covers the protruding electrode 118a and the electrode 108a. In the present embodiment, since the bump structure 123a has the protruding electrode 118a, it avails forming an intermetallic compound. Moreover, the material, characteristic, configuration, fabricating method and effect of each component in the bump structure 123a have been described in detail in the aforementioned embodiment, so that details thereof are not repeated.

Figure 1E:
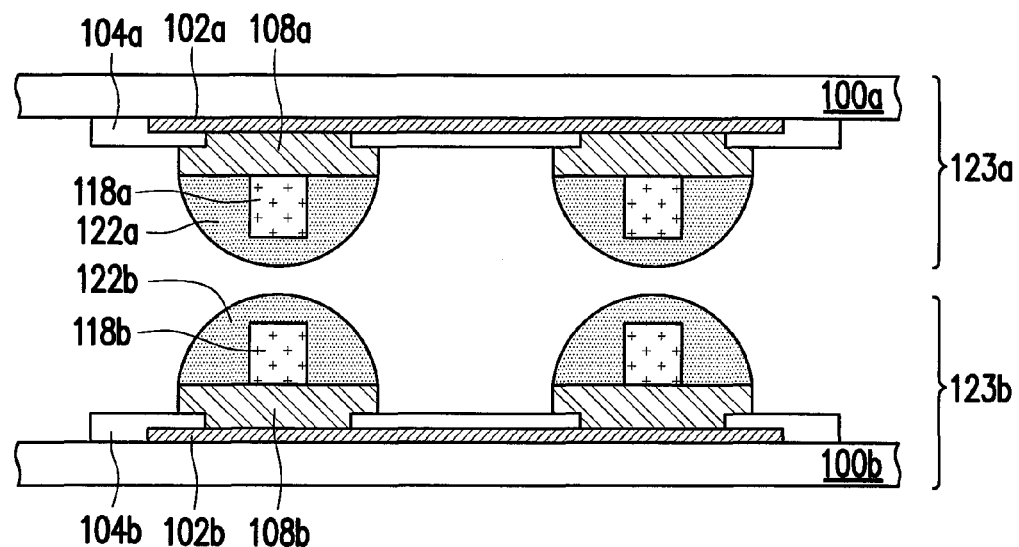

Referring to FIG. 1E, a substrate 100b is provided, and an electrode 108b, a protruding electrode 118b and a conductive material 122b have been formed on the substrate 100b, where the protruding electrode 118b is formed on the electrode 108b, and the conductive material 122b covers the electrode 108b and the protruding electrode 118b. The substrate 100b is, for example, an organic carrier or an inorganic carrier. The organic carrier is, for example, a PCB. The inorganic carrier is, for example, a silicon chip. Moreover, a pad 102b and a passivation layer 104b can be further formed on the substrate 100b. The pad 102b is formed on the substrate 100b. The passivation layer 104b is formed on the substrate 100b and the pad 102b, and exposes a part of the pad 102b. Materials of the electrode 108b and the electrode 108a can be the same or different, which is determined by those skilled in the art according to the product design. However, since the materials, configurations and fabricating methods of the electrode 108b, the protruding electrode 118b and the conductive material 122b on the substrate 100b are the similar to that of the electrode 108a, the protruding electrode 118a and the conductive material 122a on the substrate 100a, detailed descriptions thereof can refer to the descriptions of FIGS. 1A-1D, which are not repeated herein.

Here, a bump structure 123b is described with reference of FIG. 1E. The bump structure 123b includes the substrate 100b, the electrode 108b and the protruding electrode 118b. The electrode 108b is disposed on the substrate 100b. The protruding electrode 118b is disposed on the electrode 108b, where a cross-sectional area of the protruding electrode 118b is less than a cross-sectional area of the electrode 108b. A width of the protruding electrode 118b is, for example, smaller than a width of the electrode 108b. Moreover, the bump structure 123b further includes the pad 102b, the passivation layer 104b and the conductive material 122b. The pad 102b is disposed between the substrate 100b and the electrode 108b. The passivation layer 104b is disposed on the substrate 100b and the pad 102b, and exposes a part of the pad 102b. The conductive material 122b covers the protruding electrode 118b and the electrode 108b. In the present embodiment, since the bump structure 123b has the protruding electrode 118b, it avails forming the intermetallic compound. Moreover, the material, characteristic, configuration, fabricating method and effect of each component in the bump structure 123b have been described in detail in the aforementioned embodiment, so that details thereof are not repeated.

Figure 1F:
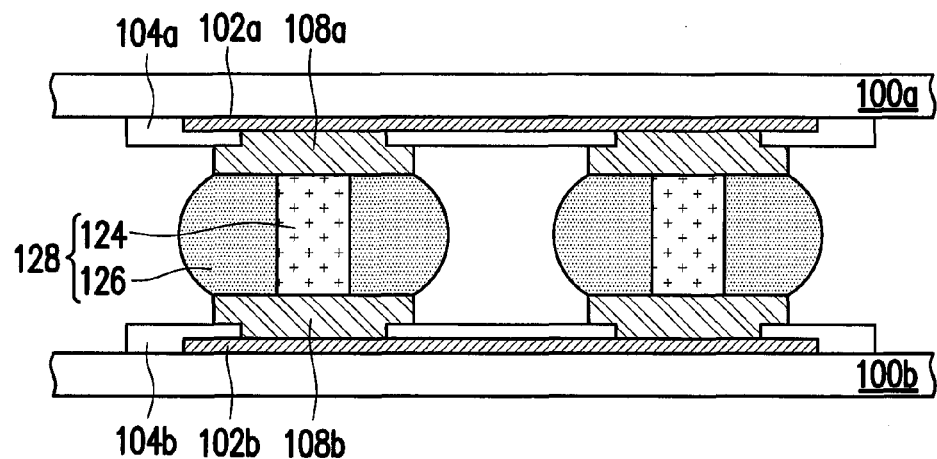

Moreover, referring to FIG. 1F, a bonding process is performed on the substrate 100a and the substrate 100b, so that the protruding electrode 118a and the protruding electrode 118b are connected to form an intermetallic compound layer 124. The intermetallic compound layer 124 is a continuous structure, and is directly connected to the electrode 108a and the electrode 108b. Moreover, in the bonding process, the conductive material 122a and the conductive material 122b are connected to form a conductive material layer 126, and the intermetallic compound layer 124 and the conductive material layer 126 form a solder joint 128. A heating temperature of the bonding process is, for example, 150° C.-300° C., and a heating time of the bonding process is, for example, 3 seconds to 60 minutes. Moreover, in the bonding process, when the protruding electrode 118a and the protruding electrode 118b again react with the conductive material 122a and the conductive material 122b, a width of the intermetallic compound layer 124 is greater than the width of the protruding electrode 118a and the width of the protruding electrode 118b.

The intermetallic compound layer 124 is, for example, a column-like structure, and a material of the intermetallic compound layer 124 is, for example, $Cu_xSn_y$, $Ni_xSn_y$, $In_xSn_y$, $Zn_xSn_y$ or $Au_xSn_y$, etc.

The intermetallic compound layer 124, for example, forms an electrical channel with the electrode 108a and the electrode 108b through a chemical bonding method.

The conductive material layer 126 is disposed around the intermetallic compound layer 124, and is connected to the intermetallic compound layer 124. Moreover, the conductive material layer 126 is, for example, connected to the electrode 108a and the electrode 108b. A material of the conductive material layer 126 is, for example, Sn, SnAg or SnAgCu, etc. A resistance coefficient of the intermetallic compound layer 124 is, for example, smaller than a resistance coefficient of the conductive material layer 126, so that when electrons flow through the solder joint 128, the electrodes flow towards the intermetallic compound layer 124 as far as possible, which may further improve the capability of anti-electromigration.

In the embodiment, although the intermetallic compound layer 124 having a column-like shape is taken as an example for descriptions, the disclosure is not limited thereto. In other embodiments, by selecting the materials of the electrode 108a and the electrode 108b, the electrode 108a and the electrode 108b can respectively react with the conductive material 122a and the conductive material 122b, and the intermetallic compound layer 124 can form an I-shape structure (similar to an intermetallic compound layer 128 of FIG. 2F). When the intermetallic compound layer 124 has the I-shape structure, the electrodes are forced to flow through the intermetallic compound layer 124, so as to further improve the capability of anti-electromigration.

According to the above embodiment, it is known that since the intermetallic compound layer 124 in the solder joint 128 is a continuous structure and is directly connected to the electrode 108a and the electrode 108b, and the conductive material layer 126 is disposed around the intermetallic compound layer 124, the electronic packaging solder joint structure may have both characteristics of anti-mechanical stress and anti-electromigration, so as to achieve better reliability and performance. Moreover, the method for fabricating the electronic packaging solder joint structure disclosed by the disclosure can be easily integrated with the existing processes.

FIGS. 2A-2F are cross-sectional views of a fabrication process of an electronic packaging solder joint structure according to another embodiment of the disclosure.

Figure 2A:
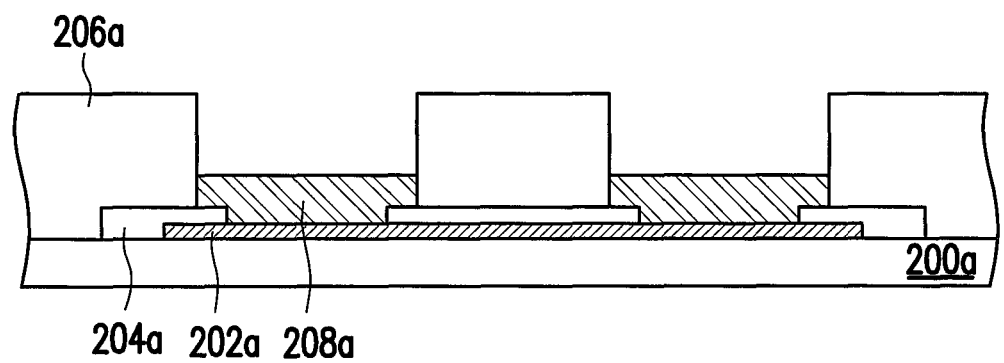
FIGS. 2A-2F are cross-sectional views of a fabrication process of an electronic packaging solder joint structure according to another embodiment of the disclosure.

Referring to FIG. 2A, a substrate 200a is provided. The substrate 200a can have a pad 202a and a passivation layer 204a formed thereon. The pad 202a is formed on the substrate 200a for electrically connecting a metal interconnect (not shown) in internal of the substrate 200a. The substrate 200a is, for example, an organic carrier or an inorganic carrier. The organic carrier is, for example, a printed circuit board (PCB). The inorganic carrier is, for example, a silicon chip. A material of the pad 202a is, for example, aluminium, aluminium silicon, aluminium silicon copper, copper or nickel, etc. The passivation layer 204a is formed on the substrate 200a and the pad 202a, and exposes a part of the pad 202a. A material of the passivation layer 204a is, for example, polyimide (PI), polybenzoxazole (PBO), Ajinomoto build-up film (ABF), $Si_xO_y$, or $Si_xN_y$, etc. The pad 202a and the passivation layer 204a are, for example, respectively formed through a deposition process and a patterning process.

A patterned photoresist layer 206a is formed on the substrate 200a, and the patterned photoresist layer 206a exposes the pad 202a. In the present embodiment, the patterned photoresist layer 206a further exposes a part of the passivation layer 204a. A material of the patterned photoresist layer 206a is, for example, positive photoresist or negative photoresist. The patterned photoresist layer 206a is, for example, formed through a photolithography process.

At least one electrode 208a is formed on the pad 202a and the passivation layer 204a exposed by the patterned photoresist layer 206a. A material of the electrode 208a is, for example, Cu, Ag, Ni, Al, Ti, W, Cr, Au, Zn, Bi, In or alloys thereof, etc. A method of forming the electrode 208a is, for example, electroplating. Although the electrode 208a is formed through the aforementioned method, the disclosure is not limited thereto.

Figure 2B:
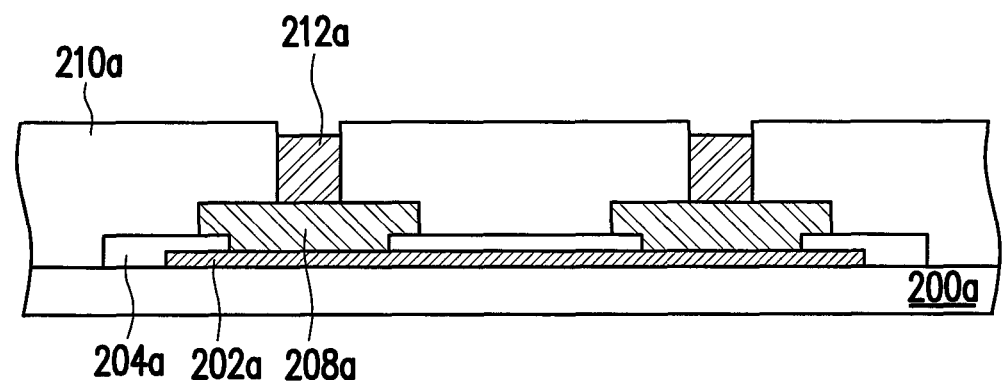

Referring to FIG. 2B, the patterned photoresist layer 206a is removed, and a method of removing the patterned photoresist layer 206a is, for example, the dry-type photoresist removing method.

A patterned photoresist layer 210a is formed on the substrate 200a, and the patterned photoresist layer 210a exposes a part of the electrode 208a. A material of the patterned photoresist layer 210a is, for example, positive photoresist or negative photoresist. The patterned photoresist layer 210a is, for example, formed through the photolithography process.

Moreover, a protruding electrode 212a is formed on the electrode 208a exposed by the patterned photoresist layer 210a. A material of the protruding electrode 212a is, for example, Cu, Ag, Ni, Al, Ti, W, Cr, Au, Zn, Bi, In or alloys thereof, etc. The materials of the protruding electrode 212a and the electrode 208a can be the same or different. A method of forming the protruding electrode 212a is, for example, electroplating. Although the electrode 212a is formed through the aforementioned method, the disclosure is not limited thereto.

Figure 2C:
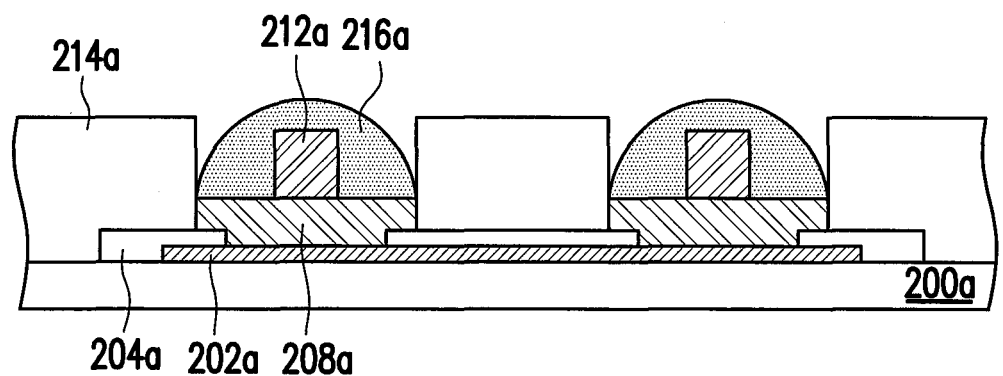

Referring to FIG. 2C, the patterned photoresist layer 210a is removed. A method of removing the patterned photoresist layer 210a is, for example, the dry-type photoresist removing method.

A patterned photoresist layer 214a is formed on the substrate 200a, and the patterned photoresist layer 214a exposes the electrode 208a and the protruding electrode 212a. A material of the patterned photoresist layer 214a is, for example, positive photoresist or negative photoresist. The patterned photoresist layer 214a is, for example, formed through a photolithography process.

At least one conductive material 216a is formed to cover the electrode 208a and the protruding electrode 212a. A material of the conductive material 216a is, for example, Sn, SnAg or SnAgCu, etc., and a method of forming the conductive material 216a is, for example, electroplating.

Figure 2D:
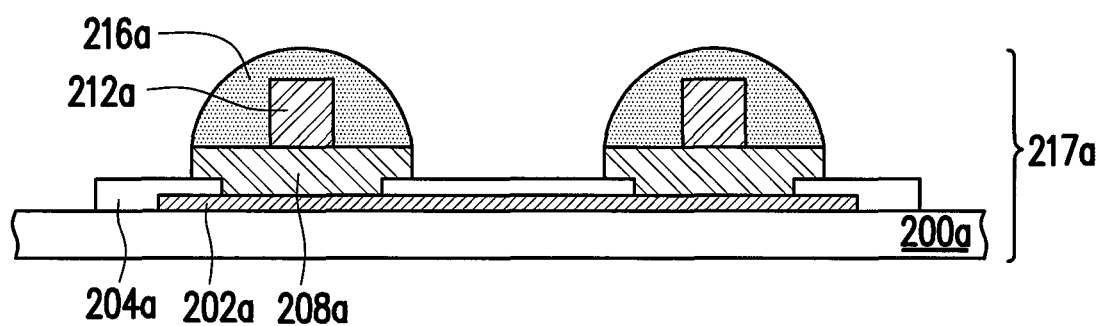

Referring to FIG. 2D, the patterned photoresist layer 214a is removed, and a method of removing the patterned photoresist layer 214a is, for example, the dry-type photoresist removing method.

Now, the electrode 208a, the protruding electrode 212a and the conductive material 216a are formed on the substrate 200a, where the protruding electrode 212a is formed on the electrode 208a, and the conductive material 216a covers the electrode 208a and the protruding electrode 212a. Moreover, the pad 202a and the passivation layer 204a are further formed on the substrate 200a. The pad 202a is formed on the substrate 200a. The passivation layer 204a is formed on the substrate 200a and the pad 202a, and exposes a part of the pad 202a.

Here, a bump structure 217a is described with reference of FIG. 2D. The bump structure 217a includes the substrate 200a, the electrode 208a and the protruding electrode 212a. The electrode 208a is disposed on the substrate 200a. The protruding electrode 212a is disposed on the electrode 208a, where a cross-sectional area of the protruding electrode 212a is less than a cross-sectional area of the electrode 208a. A width of the protruding electrode 212a is, for example, smaller than a width of the electrode 208a. Moreover, the bump structure 217a further includes the pad 202a, the passivation layer 204a and the conductive material 216a. The pad 202a is disposed between the substrate 200a and the electrode 208a. The passivation layer 204a is disposed on the substrate 200a and the pad 202a, and exposes a part of the pad 202a. The conductive material 216a covers the protruding electrode 212a and the electrode 208a. In the present embodiment, since the bump structure 217a has the protruding electrode 212a, it avails forming an intermetallic compound. Moreover, the material, characteristic, configuration, fabricating method and effect of each component in the bump structure 217a have been described in detail in the aforementioned embodiment, so that details thereof are not repeated.

Figure 2E:
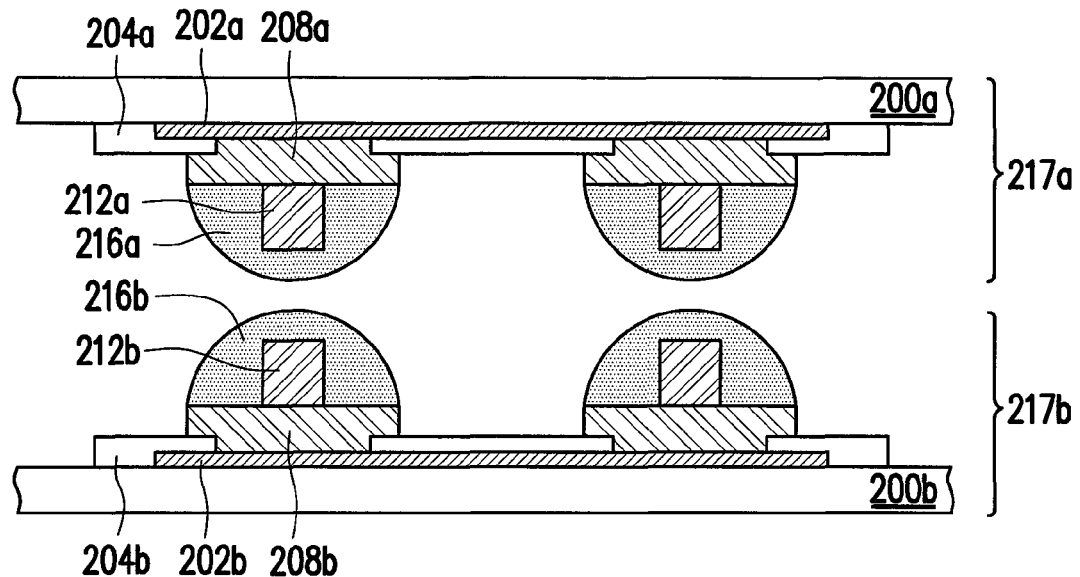

Referring to FIG. 2E, a substrate 200b is provided, and an electrode 208b, a protruding electrode 212b and a conductive material 216b have been formed on the substrate 200b, where the protruding electrode 212b is formed on the electrode 208b, and the conductive material 216b covers the electrode 208b and the protruding electrode 212b. The substrate 200b is, for example, an organic carrier or an inorganic carrier. The organic carrier is, for example, a PCB. The inorganic carrier is, for example, a silicon chip. Moreover, a pad 202b and a passivation layer 204b can be further formed on the substrate 200b. The pad 202b is formed on the substrate 200b. The passivation layer 204b is formed on the substrate 200b and the pad 202b, and exposes a part of the pad 202b. Materials of the electrode 208b and the electrode 208a can be the same or different, which is determined by those skilled in the art according to the product design. However, since the materials, configurations and fabricating methods of the electrode 208b, the protruding electrode 212b and the conductive material 216b on the substrate 200b are the similar to that of the electrode 208a, the protruding electrode 212a and the conductive material 216a on the substrate 200a, detailed descriptions thereof can refer to the descriptions of FIGS. 2A-2D, which are not repeated herein.

Here, a bump structure 217b is described with reference of FIG. 2E. The bump structure 217b includes the substrate 200b, the electrode 208b and the protruding electrode 212b. The electrode 208b is disposed on the substrate 200b. The protruding electrode 212b is disposed on the electrode 208b, where a cross-sectional area of the protruding electrode 212b is less than a cross-sectional area of the electrode 208b. A width of the protruding electrode 212b is, for example, smaller than a width of the electrode 208b. Moreover, the bump structure 217b further includes the pad 202b, the passivation layer 204b and the conductive material 216b. The pad 202b is disposed between the substrate 200b and the electrode 208b. The passivation layer 204b is disposed on the substrate 200b and the pad 202b, and exposes a part of the pad 202b. The conductive material 216b covers the protruding electrode 212b and the electrode 208b. In the present embodiment, since the bump structure 217b has the protruding electrode 212b, it avails forming the intermetallic compound. Moreover, the material, characteristic, configuration, fabricating method and effect of each component in the bump structure 217b have been described in detail in the aforementioned embodiment, so that details thereof are not repeated.

Figure 2F:
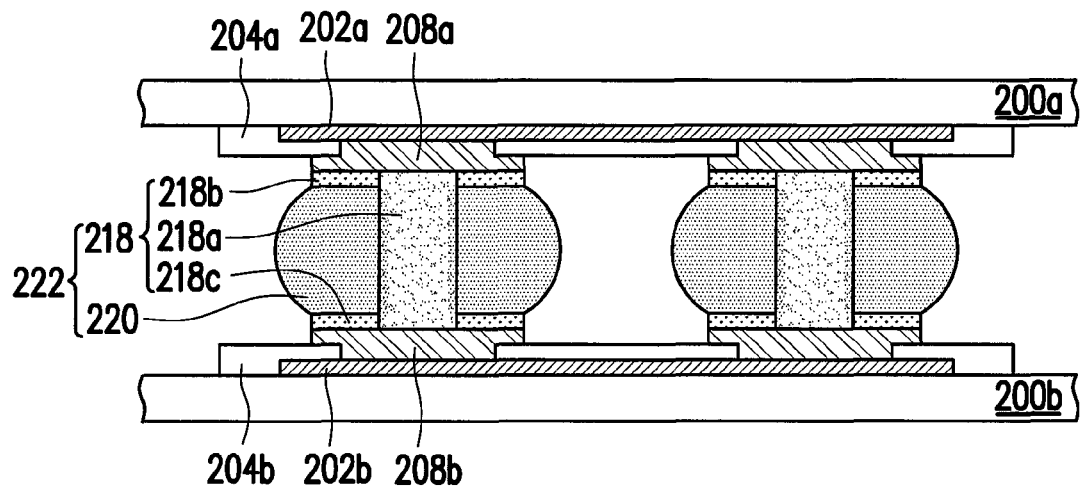

Moreover, referring to FIG. 2F, a bonding process is performed on the substrate 200a and the substrate 200b, so that the protruding electrode 212a and the protruding electrode 212b are connected, and the protruding electrode 212a reacts with the conductive material 216a and the protruding electrode 212b reacts with the conductive material 216b to form a first portion 218a of an intermetallic compound layer 218. The electrode 208a reacts with the conductive material 216a to form a second portion 218b of the intermetallic compound layer 218, and the electrode 208b reacts with the conductive material 216b to form a third portion 218c of the intermetallic compound layer 218. The intermetallic compound layer 218 is a continuous structure, and is directly connected to the electrode 208a and the electrode 208b. Moreover, a width of the first portion 218a of the intermetallic compound layer 218 is, for example, greater than a width of the protruding electrode 212a and a width of the protruding electrode 212b. Moreover, in the bonding process, the conductive material 216a and the conductive material 216b are connected to form a conductive material layer 220, and the intermetallic compound layer 218 and the conductive material layer 220 form a solder joint 222. A heating temperature of the bonding process is, for example, 150° C.-300° C., and a heating time of the bonding process is, for example, 3 seconds to 60 minutes.

In the embodiment, the intermetallic compound layer 218 is, for example, an I-shape structure, and a material of the intermetallic compound layer 218 is, for example, $Cu_xSn_y$, $Ni_xSn_y$, $In_xSn_y$, $Zn_xSn_y$ or $Au_xSn_y$, etc.

The intermetallic compound layer 218, for example, forms an electrical channel with the electrode 208a and the electrode 208b through a chemical bonding method. Moreover, since the materials of the protruding electrode 212a and the electrode 208a can be the same or different, and the materials of the protruding electrode 212b and the electrode 208b can be the same or different, materials of the first portion 218a, the second portion 218b and the third portion 218c can be the same or different, which can be determined by those skilled in the art according to the product design.

The conductive material layer 220 is disposed around the intermetallic compound layer 218, and is connected to the intermetallic compound layer 218. Moreover, the conductive material layer 220 is, for example, isolated to the electrode 208a and the electrode 208b through the intermetallic compound layer 218. A material of the conductive material layer 220 is, for example, Sn, SnAg or SnAgCu, etc. A resistance coefficient of the intermetallic compound layer 218 is, for example, smaller than a resistance coefficient of the conductive material layer 220, so that when electrons flow through the solder joint 222, the electrodes flow towards the intermetallic compound layer 218 as far as possible, which may further improve the capability of anti-electromigration.

In the embodiment, although the intermetallic compound layer 218 having the I-shape is taken as an example for descriptions, the disclosure is not limited thereto. In other embodiments, by selecting the materials of the electrode 208a and the electrode 208b, the electrode 208a and the electrode 208b do not react with the conductive material 216a and the conductive material 216b, and the intermetallic compound layer 218 only has the first portion 218a formed through reaction between the protruding electrode 212a and the conductive material 216a and reaction between the protruding electrode 212b and the conductive material 216b to form a column-like structure (similar to the intermetallic compound layer 124 of FIG. 1F).

Similarly, since the intermetallic compound layer 218 in the solder joint 222 is a continuous structure and is directly connected to the electrode 208a and the electrode 208b, and the conductive material layer 220 is disposed around the intermetallic compound layer 218, the electronic packaging solder joint structure may better reliability and performance. Moreover, when the intermetallic compound layer 218 has the I-shape structure, the electrodes are forced to flow through the intermetallic compound layer 218, so as to further improve the capability of anti-electromigration. Moreover, the method for fabricating the electronic packaging solder joint structure disclosed by the disclosure can be easily integrated with the existing processes.

The electronic packaging solder joint structures provided by the aforementioned embodiments are described below with reference of FIG. 1F and FIG. 2F.

Referring to FIG. 1F, the electronic packaging solder joint structure includes the substrate 100a, the substrate 100b and the solder joint 128. The substrate 100a has at least one electrode 108a thereon. The substrate 100b has at least one electrode 108b thereon. The solder joint 128 is disposed between the electrode 108a and the electrode 108b, and includes the intermetallic compound layer 124 and the conductive material layer 126. The intermetallic compound layer 124 is a continuous structure and is directly connected to the electrode 108a and the electrode 108b. The conductive material layer 126 is disposed around the intermetallic compound layer 124 and is connected to the intermetallic compound layer 124. The intermetallic compound layer 124 is, for example, a column-like structure. Moreover, the electronic packaging solder joint structure further includes the pad 102a, the passivation layer 104a, the pad 102b and the passivation layer 104b. The pad 102a is disposed on the substrate 100a. The passivation layer 104a is disposed on the substrate 100a and the pad 102a, and exposes a part of the pad 102a. The pad 102b is disposed on the substrate 100b. The passivation layer 104b is disposed on the substrate 100b and the pad 102b, and exposes a part of the pad 102b. Moreover, the material, characteristic, configuration, fabricating method and effect of each component in the electronic packaging solder joint structure have been described in detail in the aforementioned embodiment, so that details thereof are not repeated.

According to the above embodiment, it is known that in the electronic packaging solder joint structure, since the intermetallic compound layer 124 in the solder joint 128 is a continuous structure and is directly connected to the electrode 108a and the electrode 108b, and the conductive material layer 126 is disposed around the intermetallic compound layer 124, the electronic packaging solder joint structure may have both characteristics of anti-mechanical stress and anti-electromigration, so as to achieve better reliability and performance.

Referring to FIG. 1F and FIG. 2F, a difference between the electronic packaging solder joint structure of FIG. 2F and the electronic packaging solder joint structure of FIG. 1F is that in the electronic packaging solder joint structure of FIG. 2F, the intermetallic compound layer 218 is the I-shape structure, which is different to the intermetallic compound layer 124 of FIG. 1F that has a column-like structure. The intermetallic compound layer 218 includes the first portion 218a, the second portion 218b and the third portion 218c. The first portion 218a is connected to the electrode 208a and the electrode 208b. The second portion 218b is disposed around the first portion 218a and is connected to the electrode 208a and the first portion 218a. The third portion 218c is disposed around the first portion 218a, and is connected to the electrode 208b and the first portion 218a. Moreover, the material, characteristic, configuration, fabricating method and effect of each component in the electronic packaging solder joint structure of FIG. 2F have been described in detail in the aforementioned embodiment, so that details thereof are not repeated.

Similarly, in the electronic packaging solder joint structure, since the intermetallic compound layer 218 in the solder joint 222 is a continuous structure and is directly connected to the electrode 208a and the electrode 208b, and the conductive material layer 220 is disposed around the intermetallic compound layer 218, the electronic packaging solder joint structure may have both characteristics of anti-mechanical stress and anti-electromigration, so as to achieve better reliability and performance. Moreover, when the intermetallic compound layer 218 has the I-shape structure, the electrodes are forced to flow through the intermetallic compound layer 218, so as to further improve the capability of anti-electromigration.

In sum, the aforementioned embodiments at least has following characteristics:
1. The bump structure provided by the aforementioned embodiments avails forming the intermetallic compound.
2. The electronic packaging solder joint structure provided by the aforementioned embodiments has both characteristics of anti-mechanical stress and anti-electromigration.
3. The method for fabricating the electronic packaging solder joint structure of the aforementioned embodiment can be integrated with the existing processes to fabricate the electronic packaging solder joint structure having better reliability and performance.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. An electronic packaging solder joint structure, comprising:
   a first substrate, comprising:
      a first pad disposed on the first substrate; and
      at least a first electrode, disposed on the first pad;
   a second substrate, comprising:
      a second pad disposed on the second substrate; and
      at least a second electrode, disposed on the second pad; and
   a solder joint, disposed between the first electrode and the second electrode, and comprising:
      an intermetallic compound layer, being a continuous structure, and directly connected to the first electrode and the second electrode; and
      a conductive material layer, disposed around the intermetallic compound layer, and covering the intermetallic compound layer,
      wherein the conductive material layer and the first electrode being physically isolated with the intermetallic compound layer, and wherein the conductive material layer and the second electrode being physically isolated with the intermetallic compound layer.

2. The electronic packaging solder joint structure as claimed in claim 1, wherein the intermetallic compound layer comprises:
   a first portion, disposed on the first electrode;
   a second portion, disposed on the second electrode; and
   a third portion, connected to the first portion and the second portion, wherein a diameter of the third portion is smaller than a width of the first portion, and wherein the diameter of the third portion is smaller than a width of the second portion disposed around the first portion, and connected to the second electrode and the first portion.

3. The electronic packaging solder joint structure as claimed in claim 1, wherein a material of the intermetallic compound layer comprises $Cu_xSn_y$, $Ni_xSn_y$, $In_xSn_y$, $Zn_xSn_y$ or $Au_xSn_y$.

4. The electronic packaging solder joint structure as claimed in claim 1, wherein a material of the first electrode and the second electrode comprises Cu, Ag, Ni, Al, Ti, W, Cr, Au, Zn, Bi, In or alloys thereof.

5. The electronic packaging solder joint structure as claimed in claim 1, wherein a material of the conductive material layer comprises Sn, SnAg or SnAgCu.

6. The electronic packaging solder joint structure as claimed in claim 1, wherein a resistance coefficient of the intermetallic compound layer is smaller than a resistance coefficient of the conductive material layer.

* * * * *